United States Patent
Ohuchi

(10) Patent No.: US 6,590,287 B2
(45) Date of Patent: Jul. 8, 2003

(54) PACKAGING METHOD AND PACKAGING STRUCTURES OF SEMICONDUCTOR DEVICES

(75) Inventor: Akira Ohuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/918,479

(22) Filed: Aug. 1, 2001

(65) Prior Publication Data

US 2002/0033525 A1 Mar. 21, 2002

(30) Foreign Application Priority Data

Aug. 1, 2000 (JP) ........................................ 2000-232977
Jun. 26, 2001 (JP) ........................................ 2001-192940

(51) Int. Cl.⁷ ............................................. H01L 23/48
(52) U.S. Cl. ..................... 257/738; 257/778; 257/780; 257/781; 257/783; 257/787; 228/180.22
(58) Field of Search ................................. 257/678, 737, 257/738, 777, 778, 779, 780, 781, 782, 783, 787; 228/180.21, 180.22; 174/52.2, 52.3, 52.4; 438/106, 108, 118, 127, 612, 613

(56) References Cited

U.S. PATENT DOCUMENTS

| | | | | |
|---|---|---|---|---|
| 5,006,792 A | * | 4/1991 | Malhi et al. ................. | 324/158 |
| 5,880,530 A | * | 3/1999 | Mashimoto et al. ........ | 257/783 |
| 6,121,689 A | * | 9/2000 | Capote et al. ............... | 257/783 |
| 6,297,560 B1 | * | 10/2001 | Capote et al. ............... | 257/778 |
| 6,335,571 B1 | * | 1/2002 | Capote et al. ............... | 257/787 |
| 6,399,426 B1 | * | 6/2002 | Capote et al. ............... | 438/127 |

FOREIGN PATENT DOCUMENTS

| | | |
|---|---|---|
| JP | 2 564 728 | 10/1996 |
| JP | 10-107 095 | 4/1998 |
| JP | 10-270 833 | 10/1998 |
| JP | 2 924 830 | 5/1999 |
| WO | WO 98/31738 * | 7/1998 |
| WO | WO 99/04430 * | 1/1999 |
| WO | WO 00/79582 * | 12/2000 |

* cited by examiner

Primary Examiner—David L. Talbott
Assistant Examiner—Alonzo Chambliss
(74) Attorney, Agent, or Firm—Young & Thompson

(57) ABSTRACT

A packaging structure and a packaging method reworkable even after the formal curing and good in connection reliability, characterized in that an electrode 8 of a semiconductor device 6 and an electrode 7 of a substrate 1 are electrically connected via bumps 5, a first resin 3 decreasing in mechanical strength and becoming reworkable under given conditions and a second resin 4 capable of mitigating the stress due to a difference in thermal expansion coefficient between the semiconductor device 6 and the substrate 1 and superior in mechanical strength to the first resin under the given conditions are stacked and formed in the gap between the semiconductor device 6 and the substrate 1 and moreover the first resin 3 is formed at a thickness of less than a half of said gap in total on the surface of at least either of the semiconductor device 6 and the substrate 1.

3 Claims, 12 Drawing Sheets

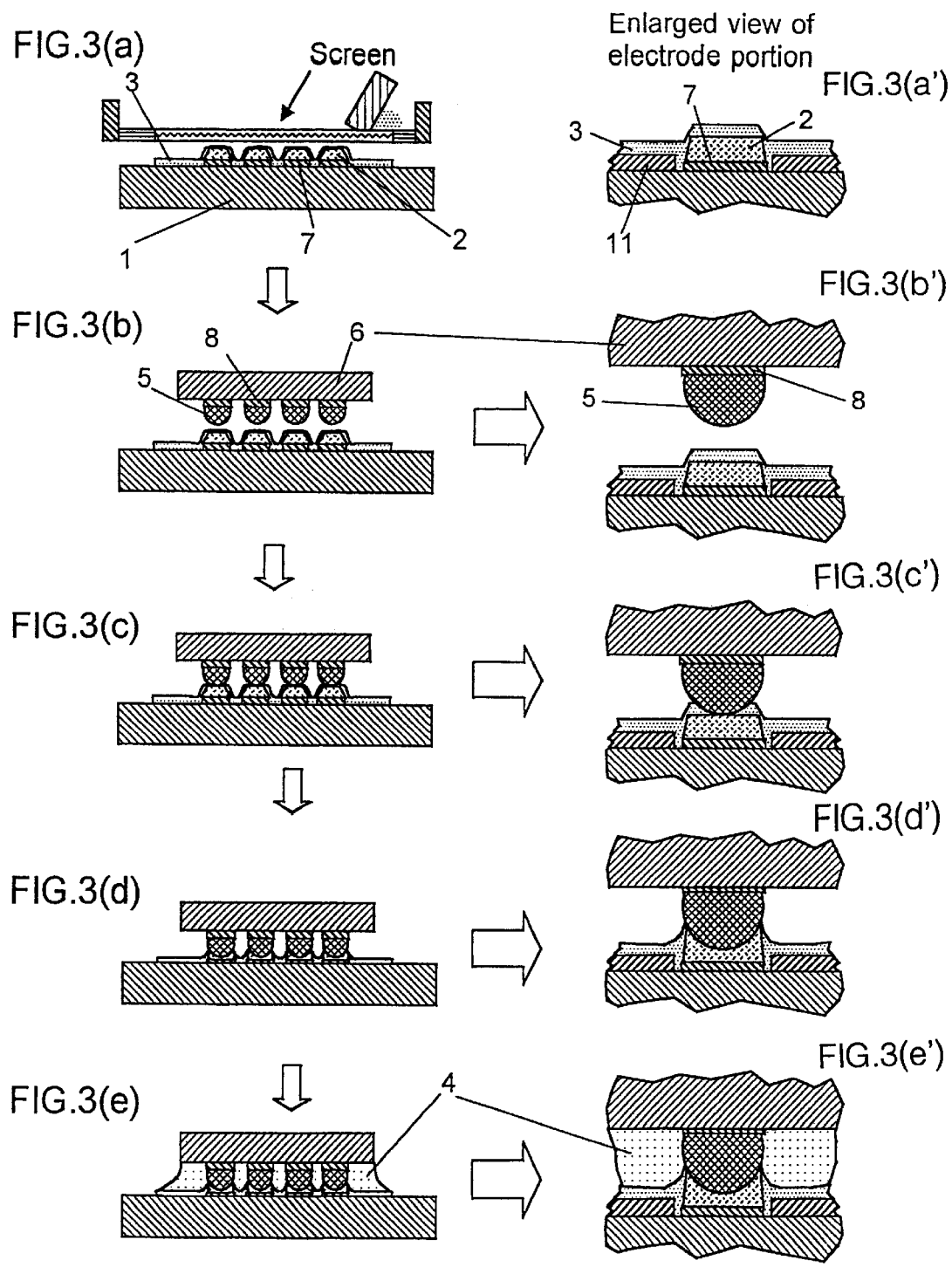

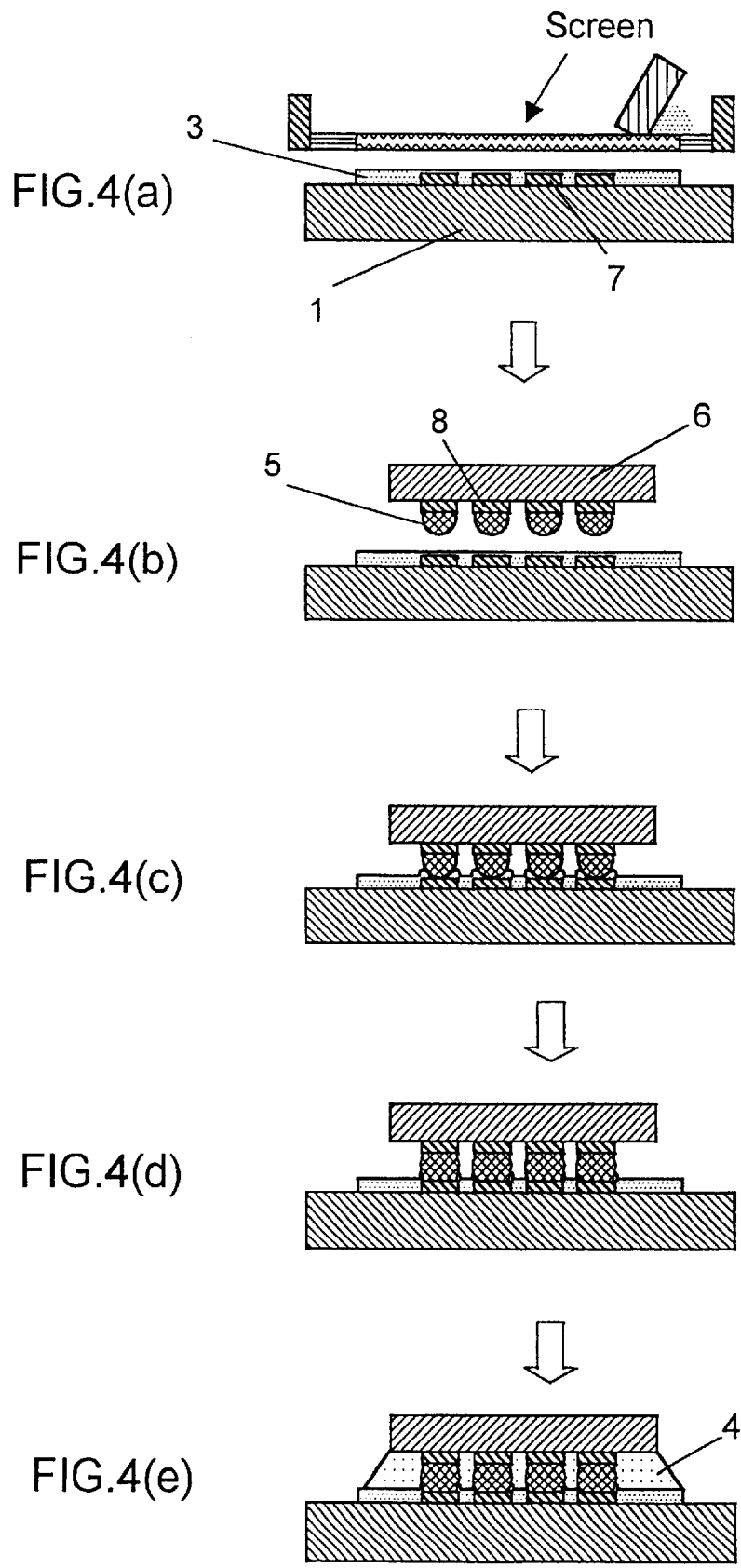

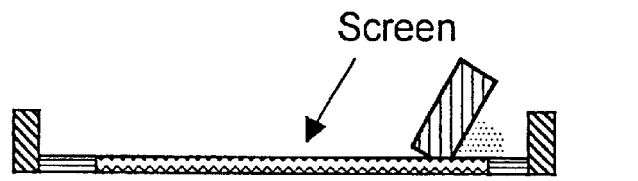
FIG.6(a)
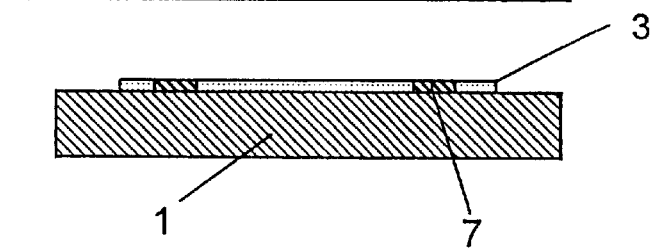
FIG.6(b)
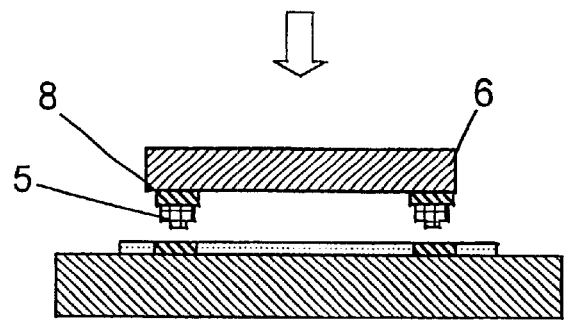
FIG.6(c)
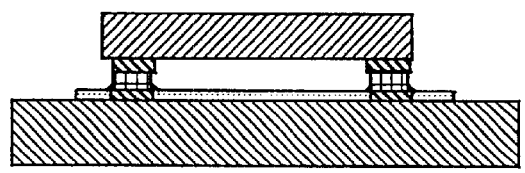
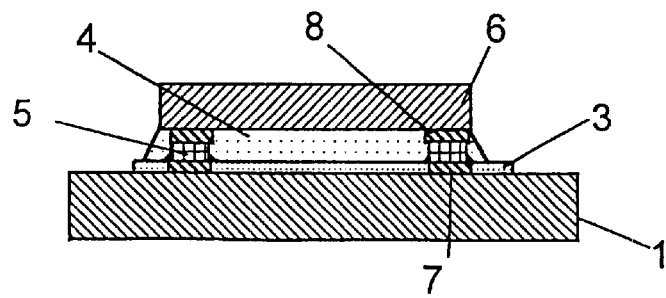
FIG.6(d)

Polishing Process

PACKAGING METHOD AND PACKAGING STRUCTURES OF SEMICONDUCTOR DEVICES

BACKGROUND OF THE INVENTION

1. Field of the Invention

The present invention relates to a packaging method and packaging structure of semiconductor devices such as bare chip with bump formed thereon or chip size package and in particular, a packaging method and packaging structure of semiconductor devices having a resin sealing packaging structure permitting an ease of rework.

2. Description of the Related Art

A flip chip packaging method having a publicly-known solder bump is shown in FIG. 11(a) to FIG. 11(d). As shown in FIGS. 11(a)–(d), there has been carried out a method comprising the steps of preparing a semiconductor device (LSI chip) 6 after the formation of a bump 5 and a wiring substrate 1 with a solder 2 formed thereon (FIG. 11(a)); aligning and mounting the semiconductor device 6 on the substrate 1 (FIG. 11(b)) after sticking a flux 9 to the bump tip of the semiconductor device 6 or the substrate 1; accomplishing the reflow, washing the flux (FIG. 11(c)), then filling an under resin 4' into a gap between the semiconductor device 6 and the substrate 1 by dint of capillarity as shown in FIG. 11(d) and finally curing a resin.

Besides, FIGS. 12(a) and 12(b) show a conventional process using no flux. After coating a thermosetting resin of flux action (hereinafter, referred to as active resin 10) onto a print substrate 1 having a pad 7 coated with solder 2, as shown in FIG. 12(a), the semiconductor device (LSI chip) 6 after the formation of a bump 5 on a pad 8 is aligned and mounted on the print substrate 1 and thereafter reflow is accomplished as shown in FIG. 12(b), thereby enabling the soldering connection without use of a flux.

Similarly, used as a flip chip packaging method using a gold bump is a method comprising the filling of an under-fill resin after mounting an LSI chip onto a wiring substrate and heat pressuring to electrically connecting the LSI and the wiring substrate via a bump or a packaging method comprising mounting an LSI chip and heat pressuring to cure a resin after coating the resin onto a substrate.

A first problem in a conventional packaging structure and method is that even when the rework of detaching the LSI chip once packaged to a substrate from the substrate and replacing it with a new LSI chip becomes necessary, it is not easy to surely remove the LSI chip fixed by use of a resin and further lead the surface of the chip-mounted substrate to a re-packageable state without the sealing resin left. This is because the sealing resin mainly composed of an epoxy resin is so designed as to lay stress to the assurance of reliability and accordingly the resin itself is so hard, the strength of adhesion to the substrate is so strong that the substrate often ends in being broken when an attempt is made to remove the LSI.

Besides, even if the LSI could be removed without the substrate is broken, the resin left on the substrate surface is firmly stuck and a large elastic modulus, hardness or the like and a mechanical strength due to the influence of a filler added usually on the order of 50–60% or the like makes it difficult to clean the resin off the substrate without damaging the surface thereof.

Thus, with respect to a problem of rework, a sealing resin reputed to be reworkable has been proposed. Concerning the adhesiveness to a substrate under operating environments of below 125° C., this resin has such an adhesion strength as capable of securing the reliability and at operating temperatures of 200° C. or higher as LSI removal temperatures, the adhesion to a substrate lowers and this resin becomes a resin of being LSI removable without breakage of the substrate. In case of this resin, however, compatibility between reliability and reworkability can hardly be obtained. For example, if the filling amount of a filler is lowered so as to facilitate the cleaning of the resin left on a substrate, the thermal expansion coefficient increases simultaneously, and the thermal stress in stretching and contracting a gap between the LSI and the substrate by a heat cycle increases, so that a similar thermal stress is given also to a solder bump, thus lowering the reliability. From these, it is considered not easy to obtain a sealing resin jointly provided with both reliability and reworkability enough for practical use.

Besides, in a conventional flip chip packaging method for connecting a bump by using a flux, there is a tendency to lower the bump height and narrow the gap between the LSI chip and the substrate especially with narrowing pitch due to a higher densitization of LSI, washing of a flux falls into more and more difficult circumstances than a conventional method, and consequently the flux residue becomes at issue still more. As a problem caused by the flux residue, when an active agent remains in electronic parts such as LSI after the flow and this remaining active agent absorbs moisture, its ionic component lowers the electric insulation, thereby causing a problem of deteriorating the reliability of an electronic part produced by migration or the like. In addition to causing a problem of reliability, the filling of under-fill is also hindered, thus causing another problem of lowering the yield of a built-up product such as LSI.

With respect to the problem of a flux residue, use of an active resin has been proposed as a method for the flip chip packaging without use of a flux as shown in FIG. 12(a) and FIG. 12(b). In the above method, however, not only having an active action necessary for the solder joining is required, but involving of air in the area enclosed with a bump is likely to occur and a void is easily generated in case of an LSI having many bumps. Besides, in executing the reflow, an exact control of the package process is demanded for a positional deviation of the LSI caused by buoyancy based on a resin or the like if the quantity of the resin is great. Accordingly, an exact control of resin characteristics such as viscosity is demanded and compatibility between flux actions (removal of a solder oxide film) and physical properties is not easy. Namely, in addition to reliability and reworkability, a further wide exact control is demanded for active actions, viscosity and the like and development of a resin satisfying all these is still more difficult.

On the other hand, various attempts have been proposed to make the reworkability and the reliability compatible. For example, Japanese Patent No. 2924830 specification discloses an arrangement of filling a thermoplastic resin and a thermosetting resin between a semiconductor device and a circuit substrate and at that time, disposing and filling the thermoplastic resin near the center of the gap formed by the semiconductor device and the circuit substrate to join them and sealing the surrounding of the thermoplastic resin with the thermosetting resin to accomplish the resin sealing. If semiconductor devices are inspected prior to the thermosetting resin sealing and revealed to be faulty, heating is made to higher temperatures than the melting point of the thermoplastic resin to remove a faulty semiconductor device and after the whole product become good, a thermosetting resin is filled for sealing and cured to seal the product with a resin.

Besides, Japanese Patent No. 2564728 discloses a case of combining resins different in curing conditions such as a photosetting resin and thermosetting resin, a photosetting resin and a spontaneous curing resin or a thermosetting resin and a spontaneous curing resin as the sealing resin. After temporarily fastening a substrate and semiconductor devices under curing conditions of either resin, semiconductor devices are inspected, and a faulty semiconductor is peeled off by soaking the product with a solvent for dissolving the organic resin if found or if the product is good, the other resin is formally cured to complete the resin sealing.

Even for any method, however, an inspection is made in a state of temporary fastening and the rework is possible in this state, but after the formal curing, the rework is difficult as is conventional. Besides, a highly reliable resin sealing is stated to be possible in either example, but in case of Japanese Patent No. 2924830 specification, since two resins different in characteristics are in contact with both a substrate and semiconductor devices, a heat cycle comprising a repetition of heating during the operation of a semiconductor device and cooling during the pause brings about a stress applied to its boundary, based on a difference of both resins in thermal expansion coefficient and there is a fear of badly affecting the semiconductor or the wires on the substrate and damaging the reliability. In case of using a photosetting resin for the other Japanese Patent No. 2564728, only an optically transparent material such as glass substrate is used as the substrate. With a spontaneous curing resin, considerable time is taken till the curing and the production yield lowers.

SUMMARY OF THE INVENTION

In a semiconductor device such as bare chip with a bump formed thereon or chip-size package, it is an object of the present invention to provide a packaging structure and a packaging method reworkable even after the formal curing and good in connection reliability.

A semiconductor device packaging structure comprises an electric connection made via bumps between the electrode of a semiconductor device and that of a wiring substrate and a stacked formation in a gap between the above semiconductor device and the above wiring substrate of a first resin decreasing in mechanical strength under given conditions and becoming reworkable and a second resin capable of moderating the stress due to a difference in thermal expansion coefficient between the semiconductor device and the wiring substrate and better in mechanical strength than the first resin under the given conditions and is characterized in that the first resin is formed at a thickness of less than a half of the above gap in total on the surface of at least either of the semiconductor device and the wiring substrate.

A semiconductor device packaging method according to the present invention comprises the steps of: coating a first resin decreasing in mechanical strength and becoming reworkable under given conditions at a thickness of less than a half of the above gap in total onto at least either one of the surface of a wiring substrate surface on which a semiconductor device is mounted and the surface of the semiconductor device at a thickness of less than a half of the above gap in total on the surface of at least either of the semiconductor device and the wiring substrate, then mounting the semiconductor device with bumps formed to electrically connect the electrode of the semiconductor device and that of the wiring substrate via bumps, thirdly filling a second thermosetting resin capable of moderating the stress due to a difference in thermal expansion coefficient between the semiconductor device and the wiring substrate into the gap between the semiconductor device and the wiring substrate to at least either one of which the first resin is coated and thereafter curing the resin.

Another semiconductor device packaging method according to the present invention comprises the steps of: coating a first resin decreasing in mechanical strength and becoming reworkable under given conditions and moreover a solder oxide film removal action (hereinafter, referred to as flux action) to the surface of a semiconductor device and mounting a solder ball, then performing the reflow and mounting bumps to the semiconductor device, further coating the first resin or a resin having a different action from that of the first resin to tips of solder bumps, mounting the semiconductor device onto the wiring substrate and electrically connecting the electrode of the semiconductor device and the electrode of the wiring substrate, thereafter filling a second resin.

Still another embodiment of semiconductor device packaging method in accordance with the present invention, for the electric connection made via bumps between the electrode of a semiconductor device and that of a wiring substrate and the gap resin-sealed between the above semiconductor device and the above wiring substrate, comprising: a step of scraping a second resin stuck to at least the tip section of the above bumps to expose a bump material quality after the curing of a second resin coated at a thickness of at least half the bump height to the surface of the semiconductor device with a bump formed and capable of moderating the stress due to a difference in thermal expansion coefficient between the semiconductor device and the wiring substrate; a step of coating a first resin deteriorating in mechanical strength under a given condition to the above wiring substrate; a step of mounting and heating the semiconductor device after the alignment of the bump thereof with the electrode of the above wiring substrate to electrically connect the semiconductor device to the electrode of the wiring substrate and a step of curing the first resin.

The first effect is to easily executing the rework of the semiconductor device.

This is because the selective removal of the semiconductor device from the first resin layer becomes possible and the resin remaining on the substrate decreases and accordingly the substrate cleaning after the removal of a chip becomes easy.

The second effect is to make the reworkability and the connection reliability easily compatible.

This is because use of a resin with its reworkability taken into account as the first resin layer permits the second resin occupying the majority of the resin sealing layer to be selected with stress laid on the connection reliability without consideration of reworkability.

Besides, in the case of using an active resin of flux property as the first resin for the solder connection, the flux cleaning step can be simplified, the equipment investment can be reduced and the package built-up cost can be saved in comparison with a conventional packaging method using a flux. Furthermore, a bad influence on reliability can be prevented which originates in the flux residue coming from poor washing.

Moreover, with a method of coating and forming the second resin a bump-formed semiconductor device prior to mounting the semiconductor device on a wiring substrate, uniform coating and curing of the second resin on the bump-formed surface of the semiconductor device makes a layer of the second resin of a stable thickness formable and further polishing and uniformizing the bump tips enables the dispersion in bump height to be prevented and at the same time the second resin stuck to the bump tips to be removed, so that a stable connection is performable at the time of mounting. Furthermore, since the first resin is necessarily formed in a uniform gap between the second resin and the substrate at the time of mounting, a stacking resin structure can be implemented stably and surely which allows the reworkability and the connection reliability to be compatible. Furthermore, since the second resin is uniformly formed prior to the mounting of the semiconductor device, the unevenness of the surface depending on the presence of bumps is extremely slight and therefore the void generated on account of a residual hollow derived from the bump unevenness at the time of mounting can be prevented.

BRIEF DESCRIPTION OF THE DRAWINGS

FIG. 3(*a*) to FIG. 3(*e*) show diagrams of process steps for a method of packaging according to the present invention, wherein solder connection is used for a semiconductor device with electrodes disposed in an area, and also show respective partially enlarged views for the electrode in respective process steps in the right side of the respective diagrams;

FIG. 4(*a*) to FIG. 4(*e*) show cross sectional views for process steps wherein eutectic solder is used for bumps disposed a semiconductor device without pre-application of solder onto a substrate;

FIG. 6(*a*) to FIG. 6(*d*) show diagrams of process steps for a method of packaging according to the present invention, wherein gold bump is used for a semiconductor device with electrodes disposed in a periphery of a semiconductor device (LSI);

DESCRIPTION OF SYMBOLS

Figure 1A:
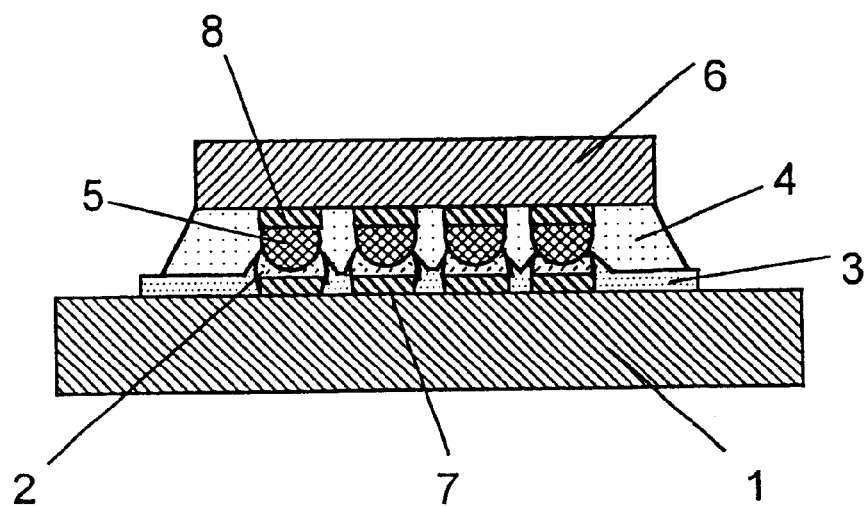
FIG. 1(*a*) is a cross sectional view showing a packaging structure according to the present invention, wherein solder connection is used for a semiconductor device with electrodes disposed in an area, and FIG. 1(*b*) is a partially enlarged view of the electrode shown in FIG. 1(*a*)

1 . . . substrate, 2 . . . solder, 3 . . . first resin, 4 . . . second resin, 4' . . . underfill resin, 5 . . . bump, 6 . . . semiconductor device, 7 . . . pad (substrate), 8 . . . pad (semiconductor device), 9 . . . flux, 10 . . . active resin, 11 . . . solder resist, 12 . . . soldering iron, 13 . . . rotating brush, 14 . . . solder ball

DETAILED DESCRIPTION OF THE PREFERRED EMBODIMENTS

With a structure according to the present invention, using sealing resin of reliable fruits as a second resin enables the thermal expanding/contracting stress given to bumps to be mitigated for the temperature cycle or the like under operating environments, which results in a good reliability. Besides, with respect to reworkability, a resin is used as a first resin which decreases in mechanical strength and becomes reworkable by heating and these first and second resins are put into a stacking structure, so that if the LSI fault is revealed during the operation, a faulty LSI chip becomes separable at the first resin by heating up to a given temperature and pulling the chip and the resin layer thinly left can be removed by means of mechanical polishing, a solvent, or the like. Like this, the reliability and the reworkability become compatible.

Next, referring to the drawings, embodiments of the present invention will be described in details.

Figure 1B:
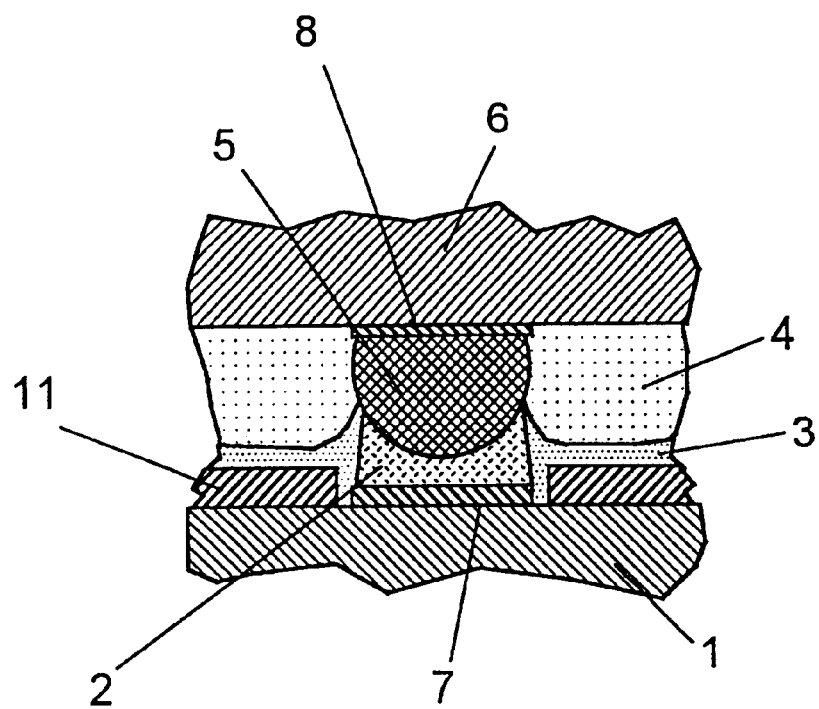

With reference to FIG. 1(*a*), the sealing resin between a semiconductor device 6 such as bare chip or chip size package and a substrate 1 comprises a first resin 3 coated on the surface of the substrate and a thermosetting resin as a second resin 4 filled between the above first resin 3 and the semiconductor device 6.

The solder 2 pre-coated on a substrate electrode (pad 7) of the substrate 1 and the bump 5 as a protruding electrode provided on a pad 8 of the semiconductor device 6 are metal-joined respectively at their corresponding positions to accomplish the electric connection of the semiconductor device 6 and the substrate 1.

FIG. 1(*b*) is an enlarged sectional view of the electrode section of FIG. 1(*a*). On the substrate surface, except the electrode section, a solder resist 11 is coated to protect the substrate surface.

For the material of a solder 2, Sn/Pb eutectic solder is used, but this material is not limited to Sn/Pb eutectic solder and, for example, Sn/Pb (except Sn/Pb eutectic), Sn/Ag, Sn/Cu, Sn/Sb, Sn/Zn, Sn/Bi and materials of specific additive elements further added to these above-mentioned materials can be referred and used properly.

For a bump 5, the same material as that of a solder 2 or solders higher in melting point may be used also.

Besides, the portion between the semiconductor device 6 and the substrate 1, except the electric connection section, is resin-sealed not only to protect the electric connection section, but also to mitigate the concentration of a thermal stress due to a difference between the semiconductor device 6 and the substrate 1 to the electric connection section and to improve the connection reliability.

The sealing resin is divided into a first resin 3 coated on the surface of the substrate 1 and a second resin 4 filled in the residual gap. By using an active resin (thermosetting resin of flux action) for the first resin 3, a bump-formed semiconductor device 6 is loaded on the substrate 1 by means of soldering connection without use of a flux and a second resin 4 is filled in the gap between the semiconductor device 6 and the first resin layer 3 after the soldering connection by use of capillarity.

The first resin 3 is uniformly formed at a thickness of less than a half of the gap between the semiconductor device and the substrate in total and, for example, if the gap between the semiconductor device 6 and the substrate 1 is 100 μm, the thickness of the first resin 3 is preferably set to a range of 5 μm to 20 μm. Namely, that of a first resin ranges preferably from 1/20 to 1/5 that of a second resin. The reason why is to make a sufficient soldering connection possible and ensure an ease of rework and the connection reliability compatible. Incidentally, for a first resin less than 5 μm in thickness, the flux action is insufficient and there are cases where no sufficient connection is obtained in case of soldering connection. Besides, if the rework is required, the breakage of a substrate becomes likely to occur at the removal of an LSI. On the other hand, if the thickness of a first resin 3 is great, the ratio of a second resin with stress laid on the reliability decreases and there are cases where no connection reliability can be obtained.

For a second resin 4 to be filled in the gap between the semiconductor device 6 and the first resin 3 by use of capillarity, selection of a resin capable of being filled in the gap becomes important with stress laid on the viscosity and the reliability. In the connection using a conventional flux, however, this needs only use of an underfill resin fruitful for the connection reliability as it is. Specifically, to facilitate there work after the packaging, selection of a resin superior to the first resin 3 is necessary at least in mechanical strength of resin or physical property such as e.g. adhesive strength or tensile strength under given conditions, e.g. at solder melting temperatures.

In order that a semiconductor device 6 can be peeled from the layer of this first resin 3 and removed from the surface of the substrate 1 at the time of reworking the semiconductor device 6, the first resin 3 is required to be weaker in mechanical strength than the second resin under given conditions. The simplest method as means of giving the reworkability is to keep the mechanical strength such as adhesive strength or tensile strength of the first resin 3 at least lower than that of the layer of the second thermosetting resin 4 at a solder melting temperature, e.g. approx. 200° C. for Sn/Pb eutectic solder.

According to the sealing resin configuration made up of these two layers, use of the first resin 3 weaker in mechanical strength than that of the second resin 4, e.g., under high temperatures, enables a semiconductor device 6 to be selectively removed from the first resin 3, and the resin remaining on the substrate 1 decreases with thinner first resin layer when the rework of the semiconductor device 6. Thus, in the reworking operation of a semiconductor device requiring the removal of the semiconductor device 6 and the cleaning of the resin left on the substrate 1, its working performance improves. Besides, since selection of a second resin 4 can be made with stress laid on the connection reliability without consideration of reworkability, the reworkablity and the connection reliability become easily compatible.

Furthermore, the first resin 3 is desired to have a flux action at the reflow. If a composition of adding agents of flux effect to a thermosetting resin serving as the basis is considered, for example, this composition acts so as to remove a solder and the oxide film of a soldering connected surface. Namely, in the heating state prior to the curing for the soldering connection, agents of flux action takes effect and accordingly a solder and the oxide film of a soldering connected surface are removed. Agents of flux action, especially the active resin described in the prior art, are combined with the basis resin to become chemically stable and has a sufficient electric insulation.

Besides, in the semiconductor device packaging step, since using an active resin of flux action as the first resin 3 eliminates the need for use of a flux, the flux washing step can be omitted and a bad influence on the reliability can be prevented which originates in the flux residue coming from poor washing.

As bases of a thermosetting resin serving for second resin, epoxy, polyesters (unsaturated polyesters and combinations of an unsaturated polyester and a compound having active hydrogen groups) and acrylates (silicon acrylates such as (meta)acryloxy propyl polysiloxane and epoxyacrylates inclusive) are referred. The basis contains an accelerator that reacts with any of the above thermosetting resins to accelerate the curing during the curing and/or a curing agent (radical initiator generating radicals or the like helpful for the curing by heating, anion initiator or cation initiator). Incidentally, adhesives curing at normal temperatures such as α-cyano acrylate are also available. Regarding the above thermosetting resins, accelerators, curing agents and initiators, a combination of two or more thereof can be used.

Besides, for a first resin, a composition similar to that of the second resin can be selected, but it is necessary to lower the mechanical strength below that of the second resin under given conditions, e.g. at higher temperatures such as solder melting temperatures. A method helpful for this includes the selection of a material inferior in thermal resistance, the use of a low molecule thermosetting resin as basis or the addition of a thermoplastic resin having a property to soften at high temperatures.

Besides, to afford the flux action to a first resin can be implemented, principally, by the addition of an unsaturated acid such as (meta)acrylic acid or maleic acid, an organic dibasic acid such as oxalic acid or malonic acid or an organic acid such as citric acid and further by the introduction of at least any one of halogen group, hydroxide group, nitrile group, benzyl group, carboxyl group and the like into the side chain of the resin. Additionally, an unsaturated alcohol such as (meta)acrylic alcohol, a trimellitic acid, a tetramellitic acid and a generally-known chelating agent are available. Such agents of flux action as mentioned above can be used in combination of two or more thereof. Incidentally, in a first resin to which the flux action is afforded, a publicly-known gelling agent can be contained.

Meanwhile, in case of formation at the side of a substrate, a first resin is preferably formed in a wider area than the one sealed by the second resin, i.e., than the sealed region thereof and the second resin is desired to be kept out of contact with the substrate. Besides, in case of forming a first resin at the side of a semiconductor device, the entire sealing region is covered all over the connection side of the semiconductor device viewed from the semiconductor device.

Figure 2A:
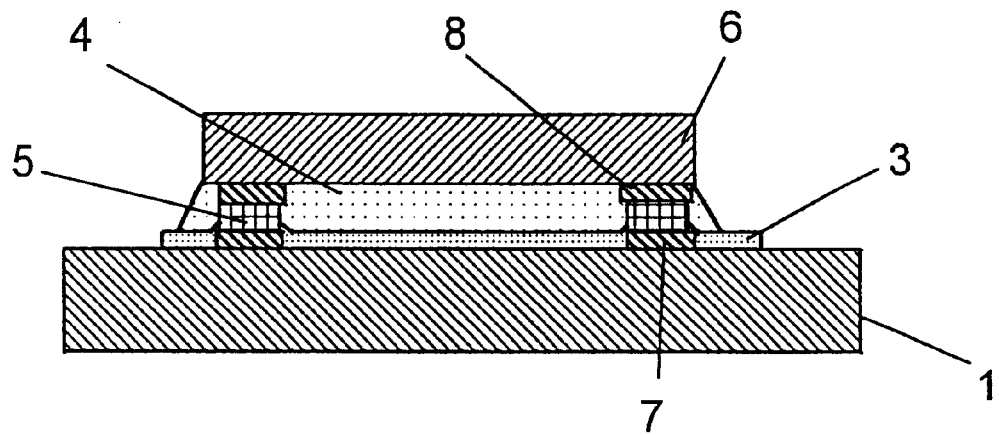
FIG. 2(*a*) is a cross sectional view of showing a packaging structure according to the present invention, wherein gold bump connection is used for a semiconductor device with electrodes arranged along a periphery of an LSI, and FIG. 2(*b*) is a partially enlarged view of the electrode shown in FIG. 2(*a*)
Figure 2B:
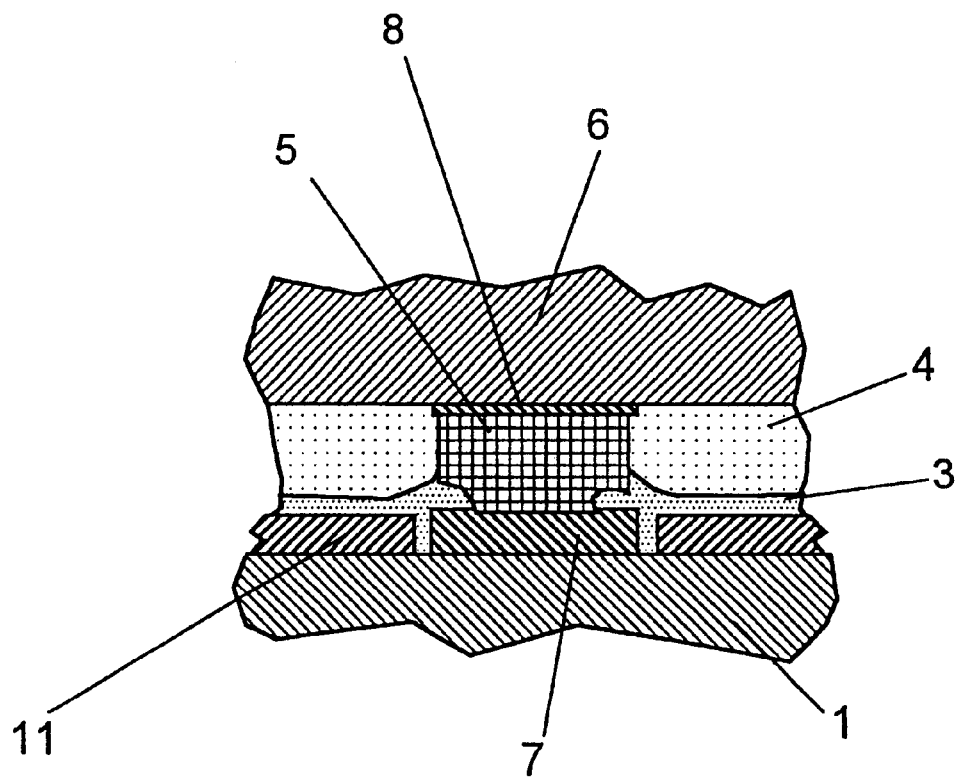

As another embodiment, FIG. 2(*a*) and FIG. 2(*b*) show a packaging structure of a semiconductor device according to the present invention in case of using a gold bump as the bump 5. In this case, as with the first implementation, the first resin 3 becomes weaker in mechanical strength than that of second resin 4 under given conditions, but may have no flux action. Incidentally, the bump 5 may be made of a metal such as Ni or Cu having a surface plated with gold.

Next, referring to FIG. 3(*a*) to FIG. 3(*e*), there will be described a method for packaging a semiconductor devices (LSI) 6 with high melting point bumps 5 formed on Cu pads 8 disposed on the area onto a printed wiring substrate 1 with Cu pads formed at identical disposed positioned and eutectic solders 2 formed as preserve solders on the pad 7.

First, as shown in FIG. 3(a), the screen printing is used to coat an active resin serving as a first resin 3 uniformly on a substrate 1 with preserve solders 2 formed thereon. The coating method of this time is not limited to the screening printing if the first resin 3 can be thinly and uniformly coated and, for example, a manner to spray and sprinkle the first resin 3 can be referred.

Then, as shown in FIG. 3(b), the semiconductor device 6 with bumps 5 formed is aligned and loaded on pads 7 of a substrate 1 under a given load. At this time, if a first resin 3 or another active resin than the first resin 3 is coated at tips of bumps 5, an active resin can be sufficiently supplied to the connection at the time of soldering connection and accordingly the connectivity is improved.

Thirdly, as shown in FIG. 3(c), the semiconductor device 6 fixed temporarily by means of viscosity of the first resin 3 is passed through a reflow furnace to melt the solder 2 and to make an electric connection between the substrate 1 and the semiconductor device 6 under flux action of the first resin 3.

To the first resin 3, after the completion of a pre-cure for the purpose of temporary fixation or the like, the post-cure can be fully accomplished.

Using a pulse heat mounter, the reflow can be carried out simultaneously with the loading. In case of reflowing at the loading, a sheet material processed in advance to a given thickness and size is also available for a first resin 3 coated on the substrate 1.

Besides, if a manner to heat and load a semiconductor device 6 on a substrate 1 while vibrating and to make an electric connection is used at the loading, the need for affording the flux action to the first resin 3 is eliminated.

With the present invention, if generated from the first resin 3 during the reflow, the volatile component is not enclosed as void because the top of the first resin 3 is open.

Besides, if the first resin 3 is of rapidly curing property, a second resin 4 can be underfilled at once. Furthermore, after pre-cured to an extent of not being fluid, the first resin 3 may be cured simultaneously with the second resin 4.

As shown in FIG. 3(e), the semiconductor device 6 and the substrate 1 connected to each other are underfilled with a second resin 4 without cleaned. The second resin 4 is heated to a given temperature on a hot plate and supplied from the lateral face of the semiconductor device 6 with the aide of a dispenser. With the present invention, since the second resin 4 is filled by means of capillarity, no void occurrence due to the involution of air takes place. By this, a semiconductor device packaging structure according to the present invention is completed.

Besides, as another way, the first resin 3 can be formed at the side of the semiconductor device. Furthermore, the first resin 3 is coated in advance to the surface of the semiconductor device at the formation of bumps and then ball attachment can be performed after the reflow.

Next, referring to FIG. 7(a) to FIG. 7(d), one example of rework in occurring case of the necessity to rework the package-completed semiconductor device 6 will be demonstrated.

Figure 7A:
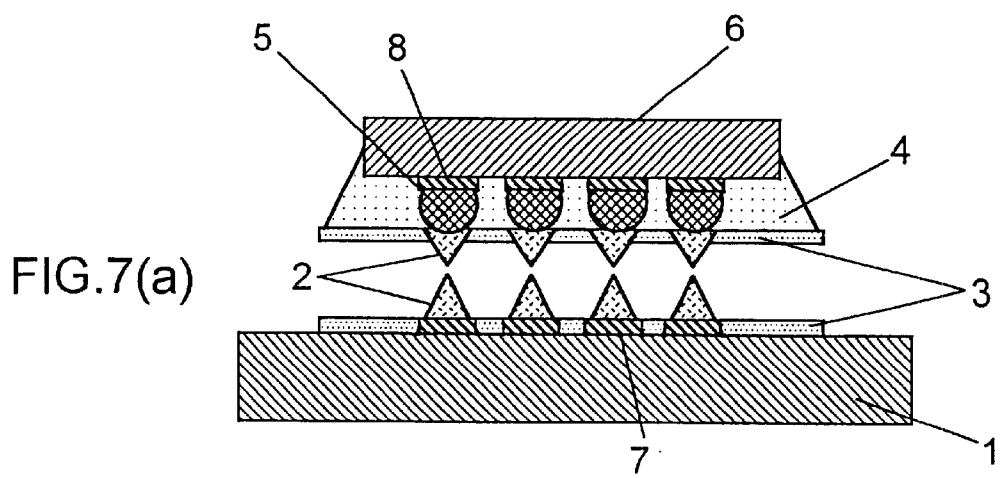
FIG. 7(*a*) to FIG. 7(*d*) show diagrams of process steps for a method of reworking, wherein solder connection is used for a semiconductor device with electrodes disposed in an area.

When the semiconductor device 6 is cramped with a jig or the like, heated till the solder 2 is melted and pulled away from the substrate 1 by addition of a tensile force, a rotational force, a flapping force or their composite force thereon, the semiconductor device 6 is peeled off from the layer of the first resin 3 as shown in FIG. 7(a).

Figure 7B:
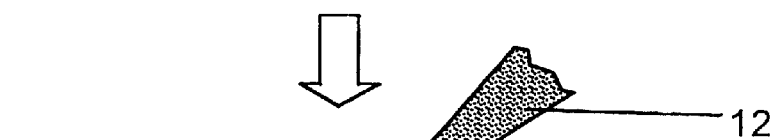
Figure 7C:
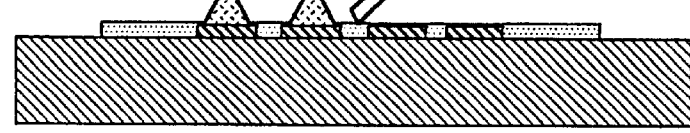
Figure 7D:
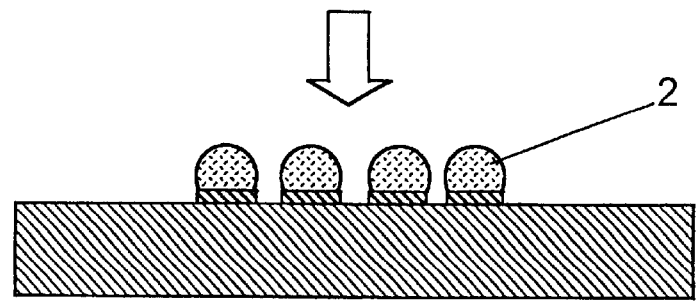

The solder 2 left on the substrate 1 is removed using a soldering gun 12 or the like (FIG. 7(b)), and further after leveling the surface of the thin film of the first resin 3 by using a bamboo spatula or the like, the residue is removed using a rotating brush 13 less hard than damaging the substrate surface (FIG. 7(c)). The thin film of the first resin 3 is removed in a weakened state brought by swelling it with a solvent, scratching it with an applicator and heating it, thus resulting in the removal of a residue. Finally, a solder 2 is re-applied to pads 7 (FIG. 7(d)). For re-soldering, use is made of a printing method or a transcription method.

After the re-soldering, re-packaging a semiconductor device is enabled if the process of FIGS. 3(a)–3(e) is again executed.

FIGS. 6(a)–6(d) show a step of packaging an LSI with gold bumps 5 formed on Al pads 8 disposed there around onto a printed wiring board with gold-plated Cu pads 7 formed on identical disposed positions.

The first resin 3 of this case need not to be an active resin of flux action and by connecting gold bumps 5 to pads 6 on the substrate 1 under heating and pressurizing at the loading of the semiconductor device 6, electric connection is accomplished between the substrate 1 and the semiconductor device 6. Other packaging steps and rework steps are similar to the examples illustrated in FIGS. 3(a)–3(e) and 7(a)–7(d).

Referring to embodiments, the present invention will be described specifically, but the present invention is not limited to these embodiments.

First Embodiment

Referring to FIG. 3, First Embodiment of the present invention will be described. Incidentally, in this embodiment, the following resins were used as first and second resins, but the present invention is not limited to these resins.

TABLE 1

| First Resin | Components | Epoxy resins: | 55–70% |
|---|---|---|---|
| | | Curing agent: | 20–30% |
| | | Organic acids (flux agents): | 5% |
| | | Thermoplastic resin (acrylic): | 5–10% |
| | Physical Properties | Tg (glass transition temperature): | 90° C. |
| | | Thermal expansion coefficient: | $7 \times 10^{-5}$° C. |
| | | Adhesive strength[1]: | |
| | | 25° C. → 7.84 – 9.8 MPa | |
| | | 200° C. → 0.0784 – 0.098 MPa | |
| Second Resin | Components | Epoxy resins: | 20–30% |
| | | Curing agent: | 10–25% |
| | | Filler: | 50–60% |
| | Physical Properties | Tg (glass transition temperature): | 140° C. |
| | | Thermal expansion coefficient: | $3 \times 10^{-5}$° C. |
| | | Adhesive strength[1]: | |
| | | 25° C. → 11.76 – 13.72 MPa | |
| | | 200° C. → 0.196 – 0.294 MPa | |

[1]Tensile Adhesive Strength using a test piece and Adhesive Strength of a first resin at the rework were 1/2 those of a second resin or less.

First, as shown in FIG. 3(a), an active resin to be a first resin 3 is uniformly coated on a substrate 1 with preserve solders 2 formed by using the screening method. On the substrate surface employed in this embodiment, except electrode portions, a solder resist 11 is coated to protect the substrate surface. The thickness of the solder resist is 20 μm (generally, order of 10–30 μm). As materials of the solder resist, thermosetting or photo-setting resins are used.

Besides, the solder resist surface need to be good in wettability with a first resin layer. This is because the surface temperature is kept at the order of 200–230° C. in the soldering connection or curing the first resin, but since the viscosity of the first resin decreases at the time, the influence of the surface tension increases, the solder resist surface repels the first resin for a bad wettability and the first resin ends in not being formed as a layer. If the wettability is bad, the solder resist surface is subjected to the plasma treatment, the UV irradiation treatment or the like and it would be advisable to improve the surface quality.

At the solder resist opening portion as a substrate side electrode, pads 7 are disposed and solder 2 is precoated on the pads.

As materials of the pads 7, this embodiment used Cu. As for size, the pad is 120 μm in diameter and 10 μm in thickness.

On the pads 7, the solder 2 is coated and in this embodiment, the top surface of solder 2 is flattened. The reason for this is as follows:

(1) In coating a first resin 3 with active function, the first resin 3 is easy to coat on the solder top surface 2 in a stable slight thickness.
(2) In loading a chip, a first resin 3 is difficult to insert between a bump 5 and a solder 2 because a deviation is made unlikely to occur in positional alignment with a spherical bump 5 and further the tip is in contact with the round bump 5.

In this embodiment, a flattened solder 2 protrudes at a length of 20 μm from the solder resist surface. In other words, the protruding height of the solder 2 becomes 20 μm from the relation:

10 μm (pad)+30 μm (solder)−20 μm (solder resist).

Then, as shown in FIG. 3(*b*), the semiconductor device 6 with the bumps formed is aligned and mounted with and on the pads 7 on the substrate 1 under a given load. A bump 5 mounted on the semiconductor device 6 are formed using high melting point solder and its size is φ120 μm.

Then, as shown in FIG. 3(*c*), a solder 2 is melted to make an electric connection between the substrate 1 and the semiconductor device 6 under flux action of the first resin 3.

Using this sample (mentioned above), connection using a reflow furnace and connection at the mounting time using a pulse heat is accomplished according to the following conditions.

TABLE 2

| In case of using a reflow furnace | (1) Load at the mounting time | 5 g/pin (number of electrodes) |
|---|---|---|
| | (2) Reflow conditions Temperature raising rate | 70° C./min. |
| | Peak temperature | 230° C. |
| In case of using pulse heats | (1) Load at the mounting time | 0.5 g/pin (number of electrodes) |
| | (2) Heating condition at the mounting time | 230° C. × 10 sec. |

The connected semiconductor device 6 and substrate 1 are not washed and underfilled with a second resin 4 as shown in FIG. 3(*e*). Temperature is raised to a given temperature by means of a hot plate and the second resin 4 is supplied from the lateral side of the semiconductor device 6 by means of a dispenser. At this time, the second resin 4 is filled after wetted and spread by the capillarity. In this manner, a semiconductor device packaging structure according to this embodiment is completed.

The evaluation result of samples varied in the coating thickness of a first resin is shown in Table 3.

TABLE 3

| Coating Thickness of First Resin | Connection Method | Solder Wettability | Temperature Cycle[1] | Rework |
|---|---|---|---|---|
| 5 μm | Reflow furnace | Poor | Unestimated | Unestimated |
| 10 μm | Reflow furnace | Good | 500 cycles clear | Capable of substrate recycling (re-soldering) |
| 20 μm | Reflow furnace | Good | 500 cycles clear | Capable of substrate recycling (re-soldering) |
| 50 μm | Reflow furnace | Good | 160 cycles | Unestimated |
| 5 μm | Pulse heat | Good | 500 cycles clear | Capable of substrate recycling (re-soldering) |
| 10 μm | Pulse heat | Good | 500 cycles clear | Capable of substrate recycling (re-soldering) |

[1]Temperature cycle Conditions: −25° C. to 125° C.

In case of reflow furnace connection, the connection became poor at coating thickness of 5 μm.

In case of connection using a reflow furnace, the connection became poor unless the soldering connection portion is fully covered with the first resin.

Thus, unless a first resin layer increases in thickness with higher protruding height of the solder 2, no good connection is implementable. This is because the pressuring force is only the self-weight of a chip in case of soldering connection using reflow furnace and accordingly it is required that the first resin 3 containing the active function is fully supplied to the connection portion between the solder 2 and the bump 5 to remove the oxide film completely. It serves as the necessary conditions for this that the first resin 3 in the periphery decreases in viscosity when heated in the reflow furnace and is wetted up to the electrode portion and the wet portion reaches the connection portion between the solder 2 and the bump 5. By dint of this action, the amount of the first resin 3 required for the soldering connection is obtained.

According to this evaluation, the connection becomes poor at a coating thickness of 5 μm equal to ¼ of the protruding height of the solder 2.

In case of connection under heating and pressuring at the mounting time:

In comparison with the heating connection using a reflow furnace, the connectivity improves greatly on account of pressurizing effect for this connection method. Thus, the first resin layer 3 can be made thinner than that of using a reflow furnace. Even for a thickness of 5 μm at which the connection was impossible for a reflow furnace, a good connection is obtained.

With respect to the reliability, the temperature cycle estimation at a thickness of 50 μm revealed that the connection becomes poor for 160 cycles and no target reliability was obtained. Since the gap between the semiconductor device and substrate after the packaging was 100 μm, the reliability was obtained for a thickness of the first resin equal to or less than ⅕, i.e., 20 μm. This is because the ratio of the second resin high in reliability increases with thinner first resin layers.

With respect to reworkability, recycling (re-soldering) of all substrates was possible within a range of 5–20 μm in which estimates were made.

Incidentally, the substrate cleaning after the removal of a semiconductor device was better in workability because of less residue with thinner first resin layers 3.

Second Embodiment

In First Embodiment, a solder 2 is formed on a pad 7 at the side of a substrate 1, but a connection between a semiconductor device and a substrate can be made without use of the solder 2. The example of this is shown in FIGS. 4(a)–4(e).

With respect to this structure, there is no solder 2 of the substrate side unlike the first embodiment and bumps 5 of the semiconductor device side were eutectic-soldered instead, then an estimate of connection in use of a reflow furnace was made.

Figure 5:
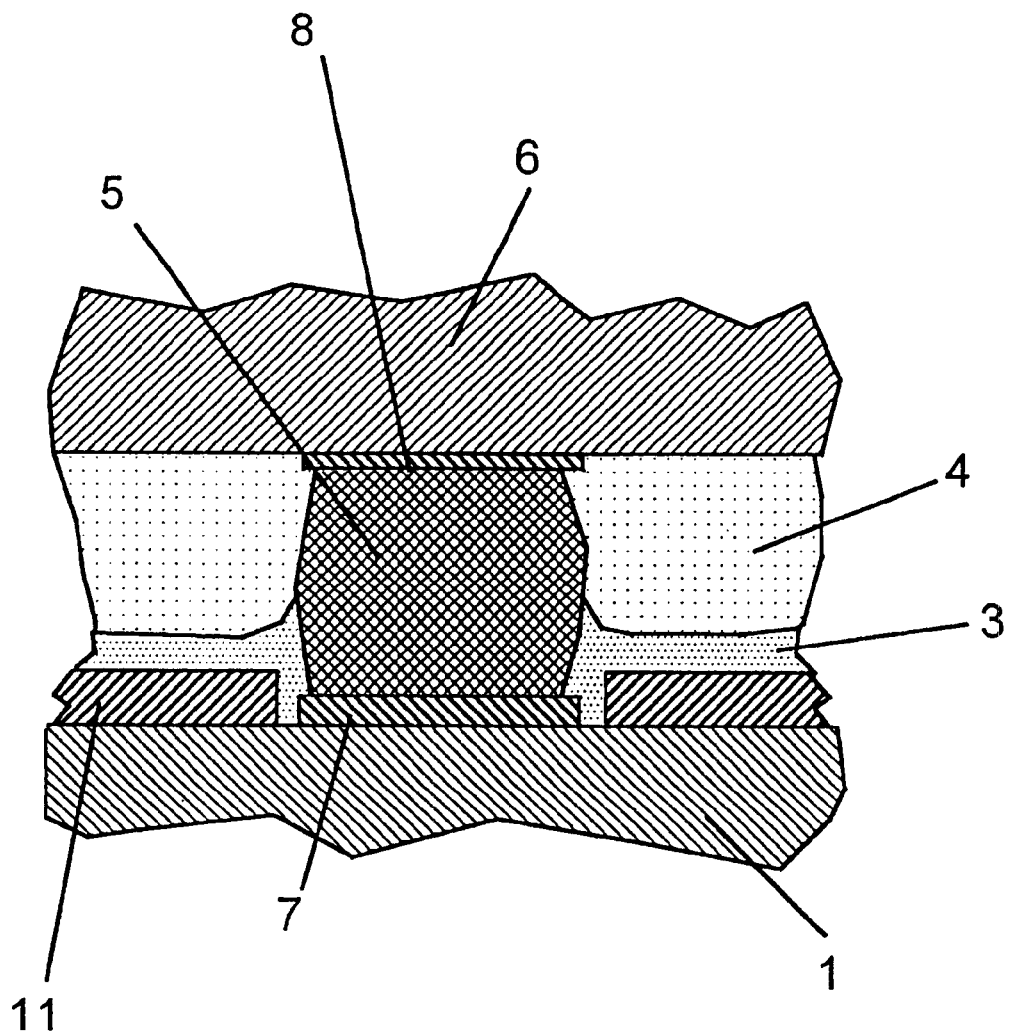
FIG. 5 is a partially enlarged view for the electrode portion shown in FIG. 4(*e*)

First, as with FIG. 3(a), a first resin 3 was coated onto the surface of the substrate 1 at a thickness of 5 μm by the screen printing method (FIG. 4(a)). In case of this structure, since the solder resist 11 is 20 μm thick, the surface of a pad 7 at the substrate side serving as connection portion is positioned approx. 10 μm lower than the solder resist surface. Namely, when a 5 μm thick resin was coated on the substrate surface, a state of an approximately 15 μm thick first resin supplied to the pad surface was brought about. Thereafter, after the alignment and mounting of bumps 5 formed on pads 8 of the semiconductor device 6 with pads 7 of the substrate 1 (FIGS. 4(b) and (c)) in a similar manner to those mentioned above, heating for the connection in a reflow furnace provided a good connection as shown in FIG. 4(d). Finally, as shown in FIG. 4(e), a second resin 4 was underfilled and cured in a similar manner to those mentioned above and thus the resin sealing was completed. FIG. 5 shows the partial enlargement diagram of the electrode section after the resin sealing.

Third Embodiment

Embodiment in the structure of FIG. 2(a) and the processing step (gold bump disposed in the periphery) of FIGS. 6(a)–6(d).

On the surface of a substrate 1, except the electrode (pad 7) section, a solder resist 11 is coated to protect the substrate surface. The solder resist is 30 μm thick. As the material, a thermosetting or photo-setting insulator resin is used. Besides, the solder resist surface need to be good in wettability with the first resin layer.

At the solder resist opening serving as the substrate side electrode, a pad 7 is disposed. In this embodiment, as material of the pad 7, an Au- or Sn-plated Cu core material was used respectively. The pad 7 is 20 μm thick.

Similar plating process may be applied for the pads 7 by using Ni as a core material.

The bumps 5 mounted on the semiconductor device side is made using gold bump with tips protruding, the thickness of the base being 30 μm, the protrusion thickness 40 μm, and the total length 70 μm.

Using this sample (mentioned above), a heating and pressuring connection with pulse heat was carried out. At the mounting, a heating peak temperature was set to 350° C. The evaluated result of samples varied in the coat thickness of a first resin is shown in Table 4.

TABLE 4

| First Resin Coat Thickness | Bump/Pad | Temperature Cycle*[2] | Rework |
|---|---|---|---|
| 5 μm | Au/Au | 500 cycles clear | Capable of substrate recycling |
| 5 μm | Au/Sn | 500 cycles clear | Capable of substrate recycling (presence of peeled traces on the pad) |
| 2 μm | Au/Sn | 500 cycles clear | LSI irremovable (breakage of substrate) |
| 2 μm*[3] | Au/Sn | 500 cycles clear | Capable of substrate recycling (presence of peeled traces on the pad) |

*[2]Temperature Cycle Conditions: −25° C. to 125° C.
*[3]After mounting of LSI followed by the curing of a first resin, a second resin is filled.
Cure Conditions: 150° C. × 90 min Since no flux action is required for the connection in this structure, no problems occurred for the connectivity did not become at issue, whereas with respect to rework, breakage of a substrate occurred during the rework at a first resin thickness of 2 μm unless the first resin is fully cured.

This is because a second resin layer is filled and cured on the first resin layer and accordingly epoxy resin is used as the first and second resins, both resins of epoxy resins are mixed into the resin interface and the physical property changes in some cases if the curing of the first resin is not enough. If the first resin is thin in these cases, the whole first resin layer becomes a layer varying in physical property and the reworkability which is to be originally afforded to the first resin is not obtained.

Besides, since no melting was confirmed for Au/Au, the electrode section after the removal of an LSI was good in reworkability, but regarding the connectivity, the first resin deposited around the connection portion after the mounting is presumed to serves for protecting the connection and accordingly a given amount of resin is considered necessary.

For Au/Sn, the melted trace of Sn was confirmed and a stronger force was required even for the removal of a chip than for Au/Au, the recycling of a substrate was available. In this case, however, since the connectivity need not to depend on the first resin, there is a possibility of being able to thin the first resin layer still more.

Fourth Embodiment

In any of the above embodiments, a first resin 3 was formed at the substrate side, but in Fourth Embodiment, cases where the first resin 3 was formed at the side of a semiconductor device will be described. Especially when solder bumps are applied to bumps to be provided on the semiconductor device, forming a first resin layer of fluxing action prior to the formation of a solder bump eliminates the need for a flux at the formation of the solder bump and can prevent the reliability from badly affected by the flux residue. Here, a working step of forming a first resin layer prior to the formation of a solder bump and completing the resin sealing will be described referring to the working step of FIGS. 8(a)–8(e).

Figure 8A:
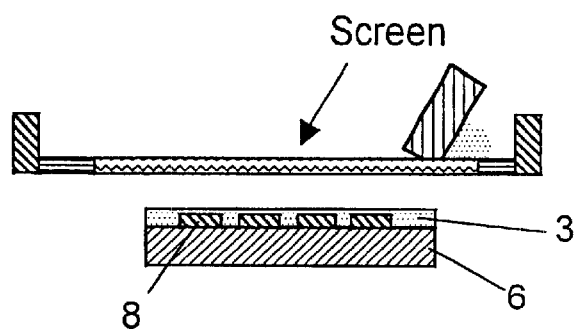
FIG. 8(*a*) to FIG. 8(*e*) are cross sectional views for process steps for describing a packaging process including process steps of forming a first resin on the semiconductor side and forming solder balls.

First, as shown in FIG. 8(a), a first resin 3 is coated all over the formed surface of a pad 8 of the semiconductor device 6 by the screen printing in a similar manner to the above-mentioned one. At this time, a first resin layer may be thick enough to cover the pad 8, but is preferably 5 μm thick or more as mentioned above to obtain a sufficient fluxing property.

Figure 8B:
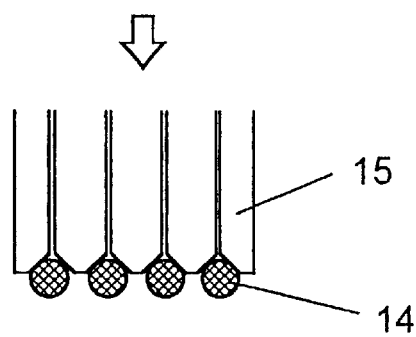
Figure 8C:
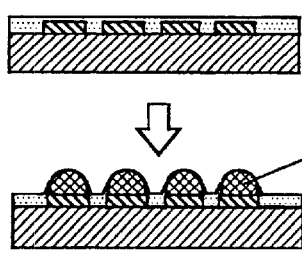

Then, as shown in FIG. 8(b), solder balls 14 are held by means of ball sticking heads 15 and transferred onto pads 8 of the semiconductor device 6 after the alignment. Reflowing is performed to form the bumps 5 (FIG. 8(c)). Incidentally, during the reflow, curing the first resin may proceed.

Figure 8D:
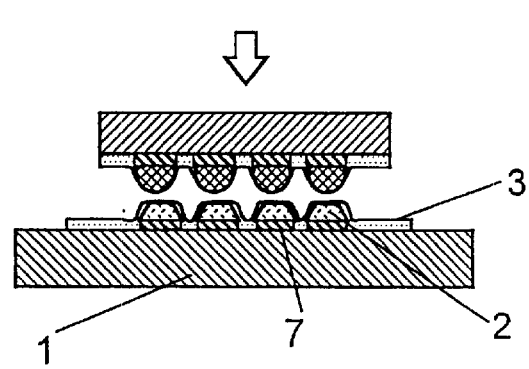
Figure 8E:
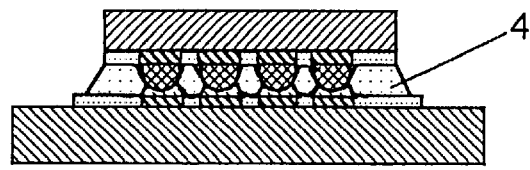

Subsequently, as with First Embodiment, the semiconductor device 6 is mounted on the substrate 1 to make an electric connection between them (FIG. 8(d)) and a second resin 4 is injected to complete the resin sealing. Incidentally, here, a description is made with the layer of the first resin 3 formed also on the side of the substrate 1, but the first resin can be coated on bumps 5, on the solder 2 or only on pads 7 without the precoat of solder 2 to make an electric connection. Alternatively, in place of the first resin, an active resin of fluxing property (no change in mechanical strength under given conditions) can also be coated on the bumps 5, on the solder 2 or only on the pads 7 without the precoat of the solder 2 to make an electric connection. In case of forming a first resin layer can be coated onto both surfaces of the substrate and the semiconductor device, since forming the first resin so as to amount to less than ½ to the gap between the substrate and the semiconductor device in total leads to a thickness of greater than ½ for the second resin, the reliability can be also secured. Besides, in case of forming a first resin layer also on the substrate side of and executing a separation at the first resin layer of the substrate side in reworking, forming the first layer to the semiconductor device side has only to be accomplished so as able to cover the bump forming portion in need of fluxing property and it is not always necessary to form the first resin all over the semiconductor device surface. Also in this embodiment, it is desired to cure the first resin in advance prior to the injection of a second resin.

Another packaging method in a flip chip packaging structure according to the present invention will be demonstrated below.

Fifth Embodiment

Referring to FIGS. 9(a) to (e), there will be described an embodiment in case of packaging a semiconductor devices 6 with high melting point bumps 5 formed on Cu pads 8 disposed on the area onto a printed wiring substrate 1 with Cu pads formed at identical disposed positions and eutectic solders 2 formed as preserve solders on the pad 7.

Figure 9A:
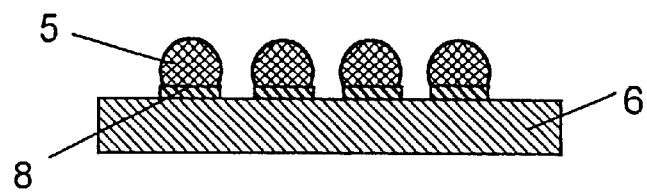
FIG. 9(*a*) to FIG. 9(*e*) are cross sectional views for process steps for a packaging method according to yet another embodiment of the present invention.

FIG. 9(a) shows a semiconductor device 6 in a state of having bumps 5 formed thereon. On the bump-formed surface of this semiconductor device 6, the screen printing is used to uniformly coat the second resin 4 used in the above embodiments. In this case, the coat thickness is desired to be ½ the bump height or greater and may be so great as to entirely cover the bump surface. The semiconductor device at the time of coating a second resin 4 may be in a completed state of dicing, but in the state of a wafer or in an uncompleted state of dicing for linked multiple semiconductor devices. In an uncompleted state of dicing, it is only necessary to complete the dicing till the mounting the semiconductor device 6 on the substrate 1.

Besides, the coating method of a second resin 4 is not limited to the above printing method and the spin coat method or the like is available, for example, if coated in the state of a wafer. If coated in a completed state of dicing, the second resin 4 is heated after the dipping to lower the resin viscosity and the resin wetting and spreading may be utilized. Besides, since the second resin can be coated prior to the mounting the semiconductor device 6 on the substrate 1, a void becomes still more difficult in occurrence and a resin layer high in reliability can be formed.

Figure 9B:
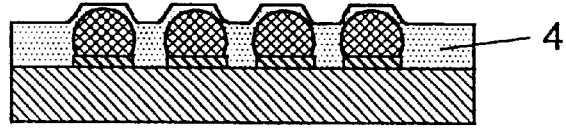

FIG. 9(b) shows a resin-completed state of the second resin 4 by heating the second resin 4 to a given temperature after the coating.

Figure 9C:
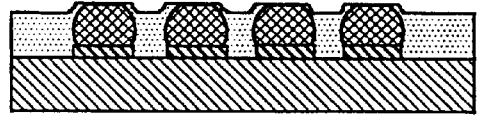

Next, as shown in FIG. 9(c), the tips of bumps 5 to which the second resin 4 is stuck are polished to expose the metal surface of the bumps 5. At this time, the polished extent of the tip of a bump 5 is desired to be ½ the initial height of the bump 5. The tip of a bump 5 after the completion of polishing may be in a state of protruding from the surface of the second resin 4 as shown in FIG. 9(c) or in a state of being polished to the same height as the surface of the second resin 4 and making a plane on the whole surface.

The polishing method is not especially limited, but conventional publicly-known mechanical polishing methods are applicable. After the polishing, the polished surface is cleaned to remove the polishing waste.

Figure 9D:
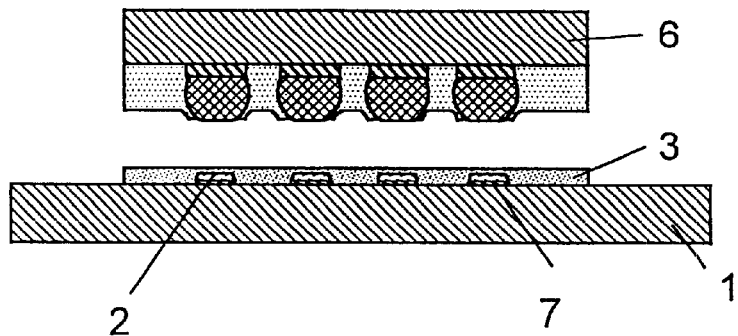
Figure 9E:
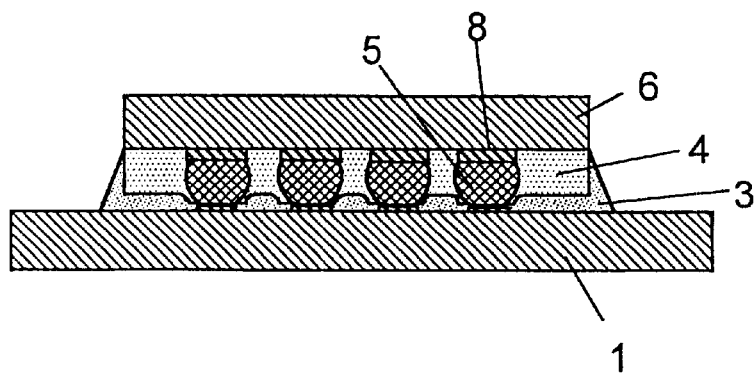
Figure 10A:
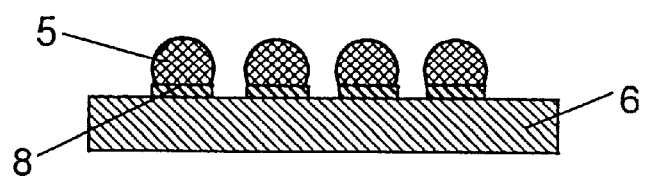
FIG. 10(*a*) to FIG. 10(*e*) are cross sectional views for describing a packaging method corresponding to the method of FIG. 9, wherein there is not pre-soldering on the substrate side.
Figure 10B:
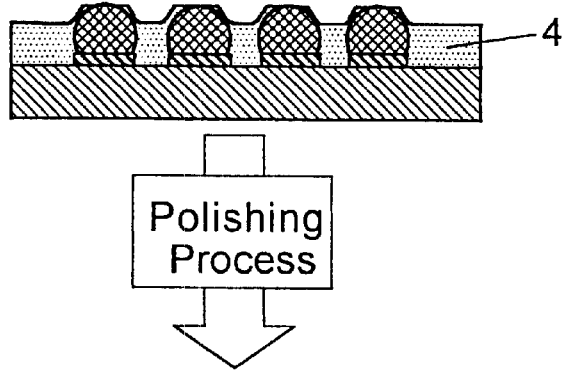
Figure 10C:
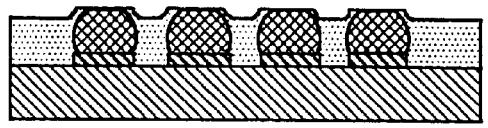
Figure 10D:
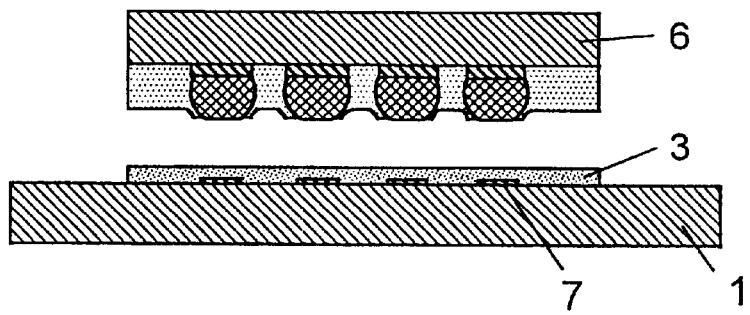
Figure 10E:
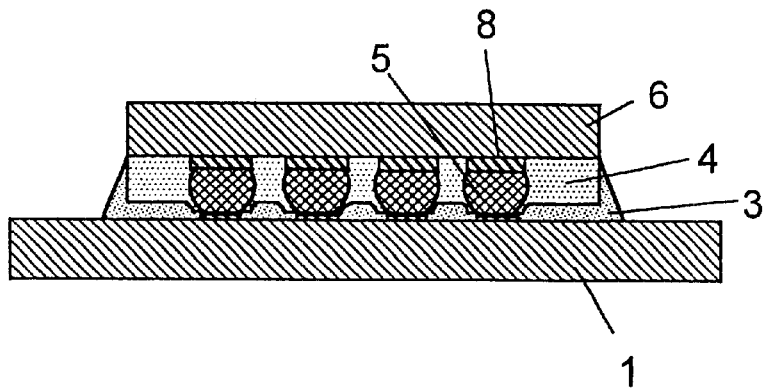
Figure 11A:
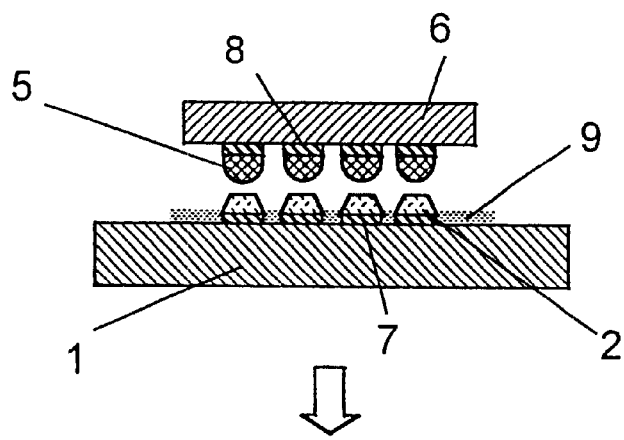
FIG. 11(*a*) to FIG. 11(*d*) are diagrams of a conventional process for describing a conventional method wherein solder connection is performed with flux for a semiconductor device with electrodes disposed in an area.
Figure 11B:
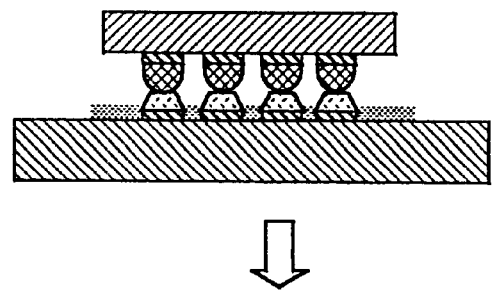
Figure 11C:
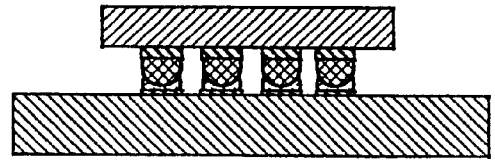
Figure 11D:
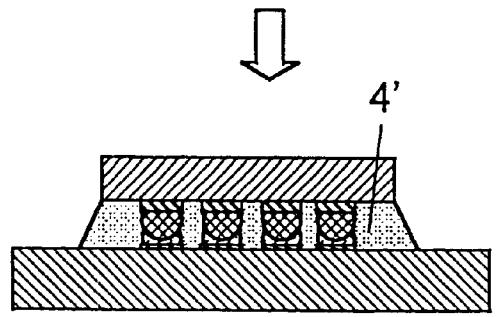
Figure 12A:
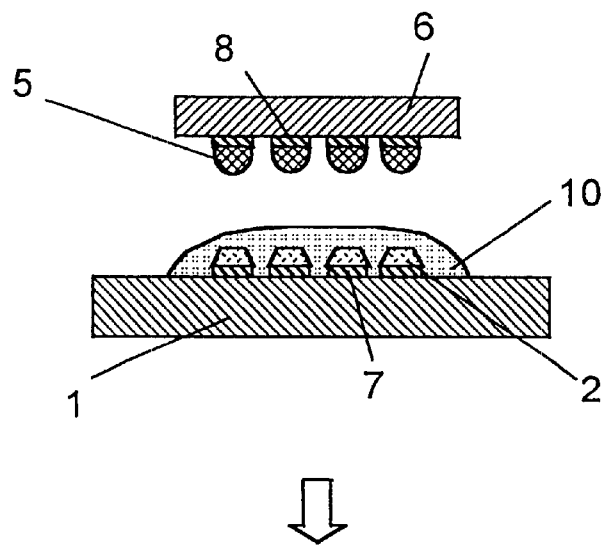
FIG. 12(*a*) and FIG. 12(*b*) are diagrams of a conventional process for describing a packaging method, wherein solder connection is performed with active resin for a semiconductor device with electrodes disposed in an area.
Figure 12B:
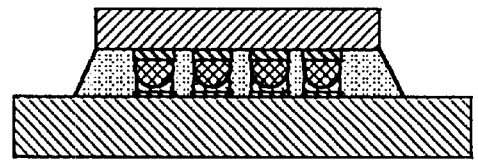

Then, as shown in FIG. 9(d), onto pads 7 of the substrate 1 coated with the first resin 3, a semiconductor device 6 is mounted under application of a given load after the alignment by a mounter device or the like in a similar manner to those of the above embodiments. Thereafter, the solder 2 is melted by heating to electrically connect the substrate 1 and the semiconductor device 6 by help of fluxing action of the first resin 3. Methods for electric connection between the semiconductor device 6 and the substrate 1 include a method of heating connection by passing the semiconductor device 6 through a reflow furnace after the mounting on the substrate 1 and a method of simultaneous connection with mounting by means of heating and pressuring function of a mounter device. Besides, if a method of connection by addition of heat and vibration at the time of mounting is applied, the need for attaching the fluxing action to the first resin 3 is eliminated.

After the electric connection between the semiconductor device 6 and the substrate 1, the first resin 3 is cured in a furnace heated to a given temperature, but the curing can be carried out simultaneously with the reflow or the mounting by the heating at the mounting time, depending on curing characteristics of the first resin 3. In case of reflow at the mounting time, a sheet material made of the first resin 3 processed to a given thickness and size in advance can be used in place of coating the first resin 3 onto the substrate 1.

As described above, according to this semiconductor device packaging method, a semiconductor device packaging structure of two-layered resin structure making the reworkability and the connection reliability easily compatible is completed. Besides, according to this method, coating of the second resin in the state of a wafer is possible, thus exhibiting the effect that the efficiency of workability is improved and further since the coating of the first resin and that of the second resin can be executed in parallel at different steps, the yield is also improved.

In the above examples, the formed case of a preserve solder on pads 7 on the substrate 1 was described, but the present invention is not limited to this and is applicable to a formed case of no preserve solder. In this case, bumps 5 are melted to achieved an electric connection between the semiconductor device 6 and the substrate 1. The aspect is shown in FIGS. 10(a)–10(e). The packaging method is the same as with FIGS. 9(a)–9(e).

Besides, in the above examples, a case of bump forming surface in a semiconductor device covered only with the second resin was shown, but as shown in FIG. 8(a), the second resin may be so arranged as to be coated after a first resin 3 of flux action is coated prior to the formation of solder bumps and bumps are formed. In that case, even if the first resin 3 coated to the side of the semiconductor device 6 is so arranged as to be coated only onto pads 8 to develop the fluxing property alone, the reworkability is fully secured by the first resin 3 formed at the side of the substrate 1.

What is claimed is:

1. A semiconductor device packaging structure comprises:
an electric connection made via bumps between an electrode of a semiconductor device and that of a wiring substrate; and a stacked formation between said semiconductor device and said wiring substrate comprising a first resin decreasing in mechanical strength and becoming reworkable under predetermined temperature conditions, and a second resin capable of moderating a stress due to a difference in thermal expansion coefficient between said semiconductor device and said wiring substrate and better in mechanical strength than the first resin under said predetermined temperature conditions, wherein the first resin is formed at a thickness of less than a half of a distance between the semiconductor device and the wiring substrate in total directly on a surface of at least either of said semiconductor device and said wiring substrate, wherein said second resin is directly on a surface of one of the semiconductor device and the wiring substrate, and wherein said first and second resins are directly secured together at an interface between the first and second resins.

2. The semiconductor device packaging structure as claimed in claim 1, wherein the semiconductor device is a bare chip or a chip-size package with bumps formed thereon.

3. A semiconductor device packaging structure comprises:

an electric connection made via bumps between an electrode of a semiconductor device and that of a wiring substrate; and a stacked formation between said semiconductor device and said wiring substrate comprising a first resin decreasing in mechanical strength and becoming reworkable under predetermined temperature conditions, and a second resin capable of moderating a stress due to a difference in thermal expansion coefficient between said semiconductor device and said wiring substrate and better in mechanical strength than the first resin under said predetermined temperature conditions, wherein the first resin is formed at a thickness of less than a half of a distance between the semiconductor device and the wiring substrate in total on the surface of at least either of said semiconductor device and said wiring substrate, and wherein the bumps are solder bumps and the first resin comprises a resin acting to remove a solder oxide film from a surface of said electric connection at said bumps.

* * * * *